US012701736B2

(12) United States Patent
Chen et al.

(10) Patent No.: US 12,701,736 B2
(45) Date of Patent: Aug. 4, 2026

(54) SEMICONDUCTOR DEVICE AND METHOD FOR MANUFACTURING THE SAME

(71) Applicant: The Hong Kong University of Science and Technology, Hong Kong (CN)

(72) Inventors: Jing Chen, Hong Kong (CN); Zheyang Zheng, Hong Kong (CN); Li Zhang, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 353 days.

(21) Appl. No.: 18/681,865

(22) PCT Filed: Aug. 12, 2022

(86) PCT No.: PCT/CN2022/112079
§ 371 (c)(1),
(2) Date: Feb. 7, 2024

(87) PCT Pub. No.: WO2023/016549
PCT Pub. Date: Feb. 16, 2023

(65) Prior Publication Data
US 2025/0142861 A1      May 1, 2025

Related U.S. Application Data

(60) Provisional application No. 63/232,664, filed on Aug. 13, 2021.

(51) Int. Cl.
*H10D 30/47* (2025.01)
*H10D 30/01* (2025.01)
(Continued)

(52) U.S. Cl.
CPC ......... *H10D 30/472* (2025.01); *H10D 30/015* (2025.01); *H10D 62/115* (2025.01);
(Continued)

(58) Field of Classification Search
CPC .. H10D 30/472; H10D 30/015; H10D 62/115; H10D 62/221; H10D 62/824;
(Continued)

(56) References Cited

U.S. PATENT DOCUMENTS

| | | | |
|---|---|---|---|
| 2012/0187452 A1 | 7/2012 | Saito et al. | |
| 2013/0083570 A1* | 4/2013 | Imada ................... | H03F 1/3247 257/E21.403 |

(Continued)

FOREIGN PATENT DOCUMENTS

| | | |
|---|---|---|
| CN | 112086362 A | 12/2020 |
| CN | 113013242 A | 6/2021 |

OTHER PUBLICATIONS

International Search Report and Written Opinion of the corresponding PCT application No. PCT/CN2022/112079 mailed on Nov. 15, 2022.

(Continued)

*Primary Examiner* — Theresa T Doan
(74) *Attorney, Agent, or Firm* — IDEA Intellectual Limited; Sam T. Yip

(57) ABSTRACT

A semiconductor device includes a buffer layer, a barrier layer, a nitride-based semiconductor layer, an isolation layer, and a gate electrode. The barrier layer is disposed on the buffer layer. The nitride-based semiconductor layer is disposed on the barrier layer and has a channel region and a doped region abutting against each other. The isolation layer covers the nitride-based semiconductor layer. The isolation layer and doped channel region can exhibit a type-II energy band alignment (staggered gate stack). The gate electrode is disposed over the isolation layer and the nitride-based semiconductor layer.

18 Claims, 16 Drawing Sheets

100A

(51) Int. Cl.

| | |
|---|---|
| *H10D 62/10* | (2025.01) |
| *H10D 62/17* | (2025.01) |
| *H10D 62/824* | (2025.01) |
| *H10D 64/27* | (2025.01) |

(52) U.S. Cl.
CPC ......... *H10D 62/221* (2025.01); *H10D 62/824* (2025.01); *H10D 64/512* (2025.01)

(58) Field of Classification Search
CPC ............... H10D 64/512; H10D 64/685; H10D 62/8503; H10D 64/513
USPC ......................................................... 257/192
See application file for complete search history.

(56) References Cited

U.S. PATENT DOCUMENTS

| | | | | |
|---|---|---|---|---|
| 2017/0236839 A1* | 8/2017 | Yamazaki | .............. | H10D 87/00 257/43 |
| 2018/0151692 A1* | 5/2018 | Chiu | .................... | H10D 30/015 |

OTHER PUBLICATIONS

Li Zhang, Zheyang Zheng, Yan Cheng, Yaat Hon Ng, Sirui Feng, Wenjie Song, Tao Chen & Kevin J. Chen, "SiN/in-situ-GaON Staggered Gate Stack on p-GaN for Enhanced Stability in Buried-Channel GaN p-FETs," 2021 IEEE International Electron Devices Meeting (IEDM), 2021, pp. 5.3.1-5.3.4.

K. J. Chen, J. Wei, G. Tang, H. Xu, Z. Zheng, L. Zhang, and W. Song, "Planar GaN Power Integration—The World is Flat," in 2020 IEEE International Electron Devices Meeting (IEDM), 2020, p. 27.1.1-27.1.4, doi: 10.1109/IEDM13553.2020.9372069.

C.-L. Tsai, Y.-H. Wang, M.-H. Kwan, P.-C. Chen, F.-W. Yao, S.-C. Liu, J.-L. Yu, C.-L. Yeh, R.-Y. Su, W. Wang, W.-C. Yang, K.-Y. Wong, Y.-S. Lin, M.-C. Lin, H.-Y. Wu, C.-M. Chen, C.-Y. Yu, C.-B. Wu, M.-H. Chang, J.-S. You, T.-M. Huang, S.-P. Wang, L. Y. Tsai, C-H. Chern, H. C. Tuan, and A. Kalnitsky, "Smart GaN platform: Performance Challenges," in 2017 IEEE International Electron Devices Meeting (IEDM), 2017, p. 33.1.1-33.1.4, doi: 10.1109/IEDM.2017.8268488.

M. Kaufmann and B. Wicht, "A Monolithic GaN-IC With Integrated Control Loop for 400-V Offline Buck Operation Achieving 95.6% Peak Efficiency," IEEE Journal of Solid-State Circuits, vol. 55, No. 12, pp. 3169-3178, Dec. 2020, doi: 10.1109/JSSC.2020.3018404.

G. Tang, M.-H. Kwan, Z. Zhang, J. He, J. Lei, R.-Y. Su, F.-W. Yao, Y.-M. Lin, J.-L. Yu, T. Yang, C.-H. Chern, T. Tsai, H. C. Tuan, A. Kalnitsky, and K. J. Chen, "High-Speed, High-Reliability GaN Power Device with Integrated Gate Driver," in 2018 IEEE 30th International Symposium on Power Semiconductor Devices and ICs (ISPSD), Chicago, IL, 2018, pp. 76-79, doi: 10.1109/ISPSD.2018.8393606.

G. Tang, A. M. H. Kwan, R. K. Y. Wong, J. Lei, R. Y. Su, F. W. Yao, Y. M. Lin, J. L. Yu, T. Tsai, H. C. Tuan, A. Kalnitsky, and K. J. Chen, "Digital Integrated Circuits on an E-Mode GaN Power HEMT Platform," IEEE Electron Device Letters, vol. 38, No. 9, pp. 1282-1285, Sep. 2017, doi: 10.1109/LED.2017.2725908.

S. J. Bader, H. Lee, R. Chaudhuri, S. Huang, A. Hickman, A. Molnar, H. G. Xing, D. Jena, H. W. Then, N. Chowdhury, and T. Palacios, "Prospects for Wide Bandgap and Ultrawide Bandgap CMOS Devices," IEEE Transactions on Electron Devices, vol. 67, No. 10, pp. 4010-4020, Oct. 2020, doi: 10.1109/TED.2020.3010471.

Z. Zheng, W. Song, L. Zhang, S. Yang, J. Wei, and K. J. Chen, "High Ion and Ion/Ioff Ratio Enhancement-Mode Buried p-Channel GaN MOSFETs on p-GaN Gate Power HEMT Platform," IEEE Electron Device Letters, vol. 41, No. 1, pp. 26-29, Jan. 2020, doi: 10.1109/LED.2019.2954035.

N. Chowdhury, J. Lemettinen, Q. Xie, Y. Zhang, N. S. Rajput, P. Xiang, K. Cheng, S. Suihkonen, H. W. Then, and T. Palacios, "p-Channel GaN Transistor Based on p-GaN/AlGaN/GaN on Si," IEEE Electron Device Letters, vol. 40, No. 7, pp. 1036-1039, Jul. 2019, doi: 10.1109/LED.2019.2916253.

Z. Zheng, L. Zhang, W. Song, S. Feng, H. Xu, J. Sun, S. Yang, T. Chen, J. Wei, and K. J. Chen, "Gallium nitride-based complementary logic integrated circuits," Nature Electronics, pp. 595-603, Jul. 2021, doi: 10.1038/s41928-021-00611-y.

M. Hua, J. Wei, Q. Bao, J. He, Z. Zhang, Z. Zheng, J. Lei, and K. J. Chen, "Reverse-bias stability and reliability of hole-barrier-free E-mode LPCVD-SiNx/GaN MIS-FETs," in 2017 IEEE International Electron Devices Meeting (IEDM), San Francisco, CA, USA, 2017, p. 33.2.1-33.2.4, doi: 10.1109/IEDM.2017.8268489.

K. Zhang, M. Liao, M. Imura, T. Nabatame, A. Ohi, M. Sumiya, Y. Koide, and L. Sang, "Electrical hysteresis in p-GaN metal-oxide-semiconductor capacitor with atomic-layer-deposited Al2O3 as gate dielectric," Applied Physics Express, vol. 9, No. 12, p. 121002, Dec. 2016, doi: 10.7567/APEX.9.121002.

* cited by examiner

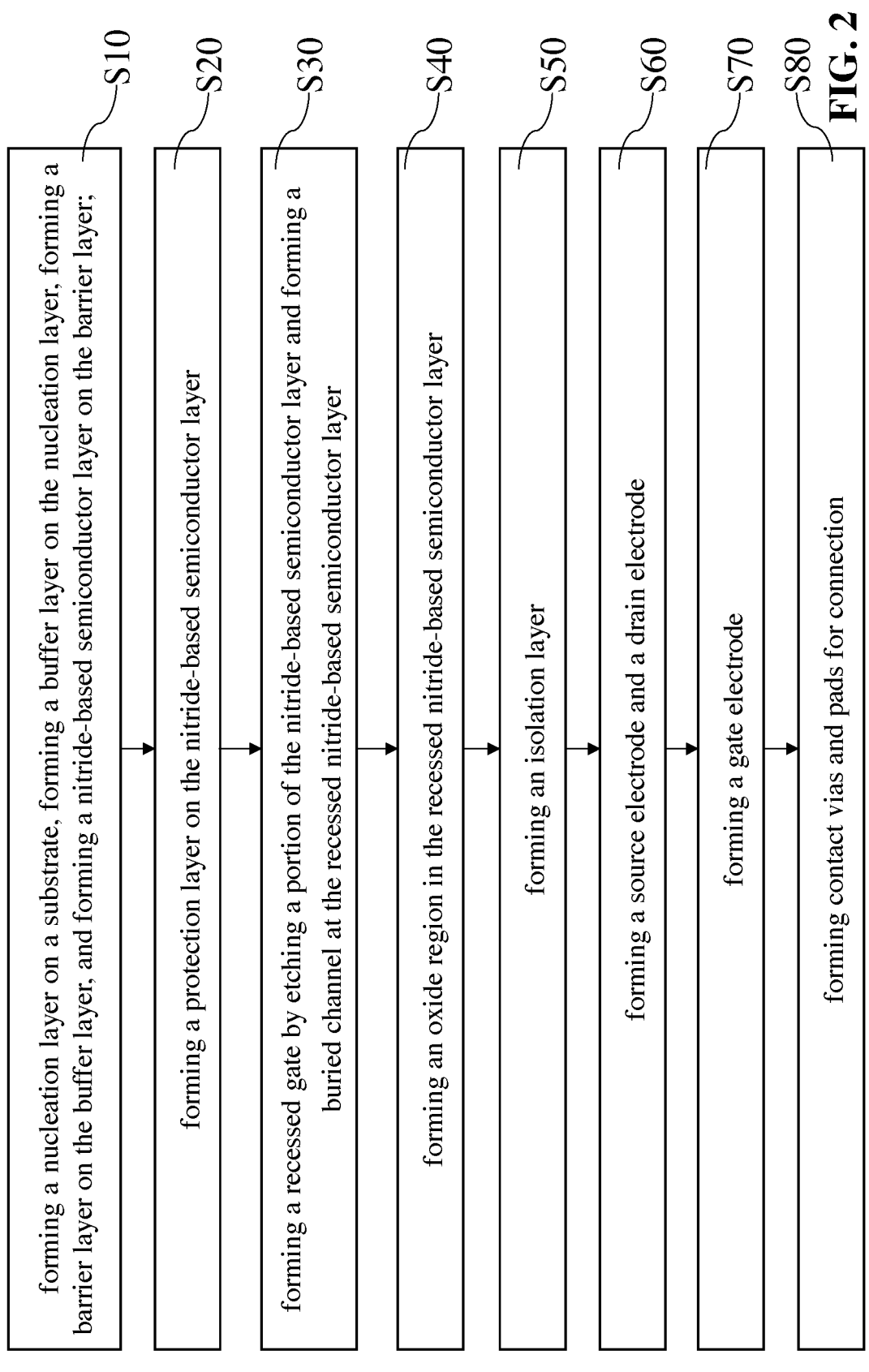

forming a nucleation layer on a substrate, forming a buffer layer on the nucleation layer, forming a barrier layer on the buffer layer, and forming a nitride-based semiconductor layer on the barrier layer; — S10 forming a protection layer on the nitride-based semiconductor layer — S20 forming a recessed gate by etching a portion of the nitride-based semiconductor layer and forming a buried channel at the recessed nitride-based semiconductor layer — S30 forming an oxide region in the recessed nitride-based semiconductor layer — S40 forming an isolation layer — S50 forming a source electrode and a drain electrode — S60 forming a gate electrode — S70 forming contact vias and pads for connection — S80

SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device having a dielectric/semiconductor stack beneath a gate electrode.

BACKGROUND OF THE DISCLOSURE

Enhancement-mode (E-mode) p-GaN gate high-electron-mobility transistors (HEMTs) for power applications have now emerged in the consumer market. The planar hetero-junction-based structure inherently favors high-density integration. It is thus compelling to develop all-GaN power integrated circuits (ICs) with both the power HEMTs and other peripheral circuits within one GaN-on-Si chip, which is expected to fully unlock the potential of GaN in power electronics.

Logic circuits are ubiquitous in the peripheral circuitry of power systems, for the driver, the controller, protection modules and miscellaneous sensors. The complementary logic (CL) circuit topology featuring p-channel field-effect transistors (p-FETs) in the pull-up network and n-channel ones (n-FETs) in the pull-down network is the most energy-efficient. However, dominant logic circuit schemes of GaN still rely on n-FETs only (e.g., the directly-coupled FET logic, DCFL) due to the absence of practically useable p-FETs.

The commercial p-GaN gate power HEMT platform is compelling for developing GaN p-FETs, as it not only offers a suitable venue—the p-GaN layer—for the p-channel but also naturally enables a rather smooth integration with the p-GaN gate n-channel HEMT and power HEMT once p-FETs are ready. High ON/OFF ratio E-mode p-FETs and CL ICs have been realized on this platform, with a complete set of NOT, NAND, and NOR gates and multiple-stage logic circuits available. It thereby becomes vital to optimize the device/circuit performance and, in particular, enhance their stability to facilitate the advent of CL-featured all-GaN power integration.

SUMMARY OF THE DISCLOSURE

In accordance with one aspect of the present disclosure, a semiconductor device is provided. The semiconductor device includes a buffer layer, a barrier layer, a nitride-based semiconductor layer, an isolation layer, and a gate electrode. The barrier layer is disposed on the buffer layer. The nitride-based semiconductor layer is disposed on the barrier layer and has a channel region and a doped region abutting against each other. The isolation layer covers the nitride-based semiconductor layer. The gate electrode is disposed over the isolation layer.

In accordance with one aspect of the present disclosure, a method for manufacturing a semiconductor device is provided. The method includes steps as follows. A buffer layer is formed on a substrate. A barrier layer is formed on the buffer. A nitride-based semiconductor layer is formed on the barrier layer. A buried channel is formed in the nitride-based semiconductor layer. An isolation layer is formed to cover the nitride-based semiconductor layer. A gate electrode is formed over the isolation layer. A source electrode and a drain electrode are formed at the opposite sides of the gate electrode.

By the above configuration, hole trapping can be removed and thus the stability of the semiconductor device is enhanced.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 2 illustrates a flow chart of a method for manufacturing a semiconductor device according to some embodiments of the present disclosure;

DETAILED DESCRIPTION

Figure 1:
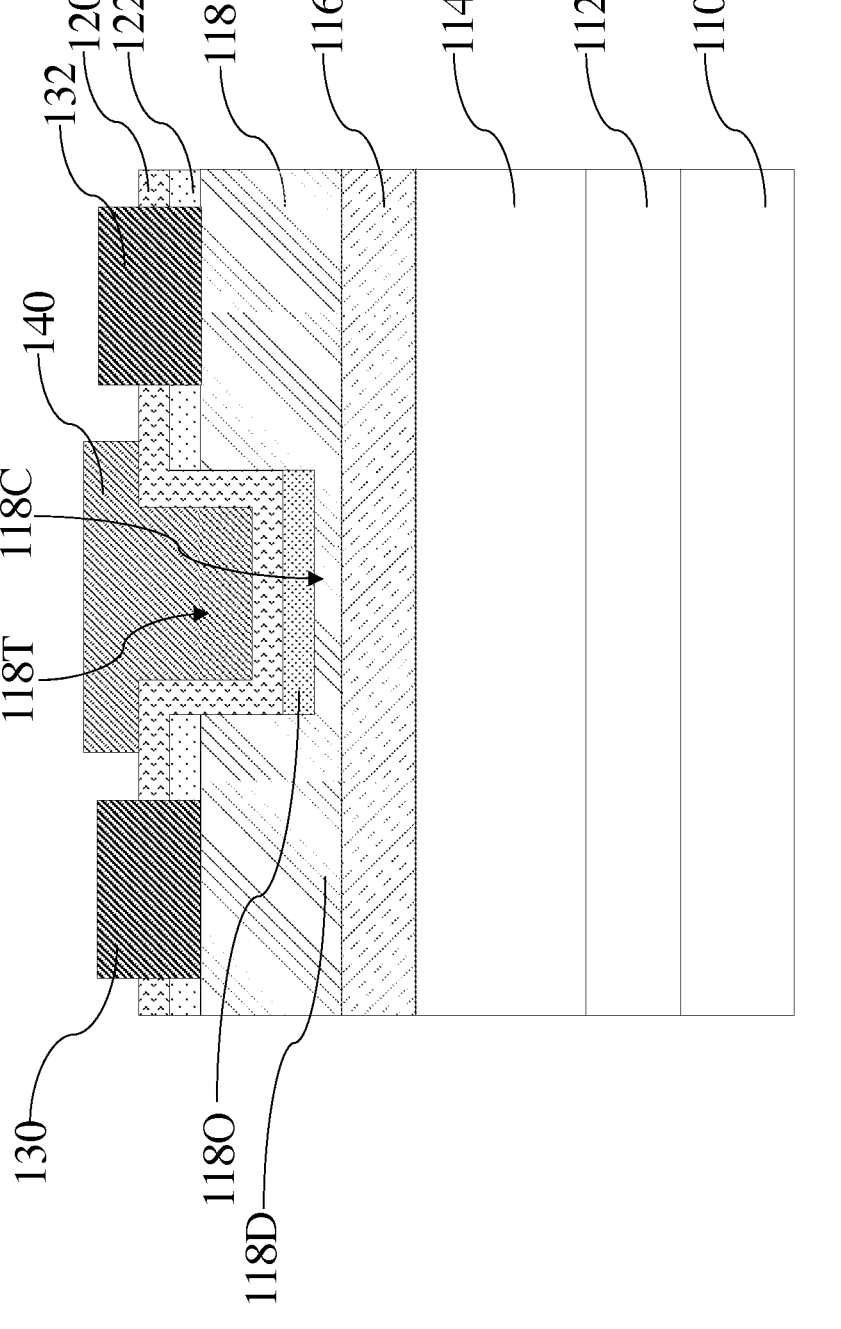
FIG. 1 is a vertical view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Generally, GaN p-FETs use oxides (e.g., $SiO_2$, $Al_2O_3$) as a gate dielectric. Oxides usually deliver a higher barrier for suppressing gate leakage. However, oxide/GaN interfaces will reduce stability due to high-density traps. There is high density of hole traps, especially near the edge of valence band (VB). Also, pronounced hysteresis can be observed in a metal/$Al_2O_3$/p-GaN capacitor. In order to improve issues above, the present disclosure is to provide a semiconductor structure to reduce density of hole traps, which will be advantageous to raise device stability.

FIG. 1 is a vertical view of a semiconductor device 100A according to some embodiments of the present disclosure. The nitride-based semiconductor device 100A includes a substrate 110, a nucleation layer 112, a buffer layer 114, a barrier layer 116, a nitride-based semiconductor layers 118, an isolation layer 120, a protection layer 122, a source electrode 130, a drain electrode 132, and a gate electrode 140.

The substrate 110 may be a semiconductor substrate. The exemplary materials of the substrate 110 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 110 can include, for example, but is not limited to, group III elements, group IV elements, group V elements, or combinations thereof (e.g., III-V compounds), such as AlN, GaN.

The nucleation layer 112 is disposed over the substrate 110. The nucleation layer 112 may be formed between the substrate 110 and the buffer layer 114. The nucleation layer 112 can be configured to provide a transition to accommodate a mismatch/difference between the substrate 110 and the buffer layer 114. The exemplary material of the nucleation layer can include, for example but is not limited to AlN, GaN, InN, or combinations thereof.

The buffer layer 114 can be disposed over nucleation layer 112. The buffer layer 114 can be disposed between the substrate 110 and the barrier layer 116. The buffer layer 114 can be configured to reduce lattice and thermal mismatches between the substrate 110/nucleation layer 112 and the barrier layer 116, thereby curing defects due to the mismatches/difference. The buffer layer 114 may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlN, InN, AlGaN, InAlGaN, or combinations thereof.

The barrier layer 116 can be disposed on/over/above the buffer layer 114. The nitride-based semiconductor layer 118 can be disposed on/over/above the barrier layer 116. The exemplary materials of the barrier layer 116 can include, for example but are not limited to, nitrides or group III-V compounds, such as GaN, AlN, InN, $InxAl_yGa_{(1-x-y)}N$ where $x+y \leq 1$, $Al_yGa_{(1-y)}N$ where $y \leq 1$. The exemplary materials of the nitride-based semiconductor layer 118 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the barrier layer 116 and the nitride-based semiconductor layer 118 are selected such that the nitride-based semiconductor layer 118 has a bandgap (i.e., forbidden band width) less than a bandgap of the barrier layer 116, which causes electron affinities thereof different from each other and forms a heterojunction therebetween. As such, a triangular well potential is generated at a bonded interface between the barrier layer 116 and the nitride-based semiconductor layer 118, so that holes accumulate in the triangular well, thereby generating a two-dimensional hole gas (2DHG) region adjacent to the heterojunction. Accordingly, the semiconductor device 100 is available to include at least one GaN-based high-hole-mobility transistor (HHMT). In some embodiments, the semiconductor device 100 includes a gallium nitride (GaN) buried-channel p-field-effect transistor (p-FET).

The nitride-based semiconductor layer 118 has a channel region 118C and a doped region 118D abutting against each other. For example, the nitride-based semiconductor layer 118 can be formed by a p-doped GaN layer first, and the channel region 118C is treated by a process to reduce doping concentration so as to make the channel region 118C act as a buried channel. The doped region abutting 118D can be free from the process (e.g., by protected by a mask or a layer) so it can remain as p-GaN. The nitride-based semiconductor layer 118 may include a GaN region and a p-doped GaN region.

The nitride-based semiconductor layer 118 has a trench 118T. The channel region 118C aligns with the trench 118T and is located beneath the trench 118T. The nitride-based semiconductor layer 118 further has an oxide region 118O over the channel region 118C, which means the channel region 118C is located between the oxide region 118O and the barrier layer 116. The oxide region 118O is adjacent to a bottom of the trench 118T. For example, the oxide region 118O coincides with the bottom of the trench 118T. In some embodiments, the oxide region 118O and the trench 118T have substantially the same width.

The exemplary materials of the oxide region 118O can include, for example but are not limited to $Ga_xON_{(1-x)}$ where $x \leq 1$. In some embodiments, the oxide region 118O is formed from crystalline GaON. The oxide region 118O can be configured to build a staggered gate stack, which is detailly described as follows.

The isolation layer 120 is disposed on/above/over the nitride-based semiconductor layer 118. The isolation layer 120 extends from a position over the top-most surface of the nitride-based semiconductor layer 118 to the trench 118T, in which the trench 118T can accommodate a portion of the isolation layer 120. In the trench 118T, the isolation layer 120 can cover the oxide region 118O and make contact with the oxide region 118O. That is, the isolation layer 120 has a portion in contact with the oxide region 118O and have the same width as that of the oxide region 118O.

The exemplary materials of the isolation layer 120 can include, for example but are not limited to, silicon-based dielectric layer, nitride-based dielectric layer, or combinations thereof, such as $SiN_x$. In some embodiments, the isolation layer 120 is a multi-layered structure, such as a composite dielectric layer of silicon-based dielectric layer, nitride-based dielectric layer, or combinations thereof.

The gate electrode 140 is disposed over the isolation layer 120 and the oxide region 118O of the nitride-based semiconductor layer 118. The gate electrode 140 aligns with the channel region 118C and is located above the channel region 118C. The isolation layer 120 and the oxide region 118O are sandwiched between the channel region 118C and the gate electrode 140. The bottom of the gate electrode 140 is located within the trench 118T and the isolation layer 120 can wrap the bottom of the gate electrode. The exemplary materials of the gate electrode 140 can include, for example but are not limited to, Ni, Ti, Au, Mo, W, TiN, or combinations thereof.

The isolation layer 120 and the oxide region 118O can collectively form a staggered gate stack between the barrier layer 116 and the gate electrode 140. The isolation layer 120 and the oxide region 118 can include a dielectric material and semiconductor material, respectively, which are selected to have a type-II energy band alignment in the staggered gate stack. In some embodiments, the staggered gate stack includes GaON, $SiN_x$, or combinations thereof. In some embodiments the staggered gate stack includes a SiN/GaON interface therein. In this regard, hole interface traps at the SiN/GaON interface are exposed to the valence band of SiN to remove hole trapping and thus enhance the stability of the semiconductor device 100A. Moreover, GaON can provide sufficient hole barrier to block holes from transporting to the gate electrode 140.

The protection layer 122 is disposed on the nitride-based semiconductor layer 118. The protection layer 122 can provide protection during the manufacturing process of the semiconductor device 100A. The protection layer 122 is located between the nitride-based semiconductor layer 118 and the isolation layer 120.

The source electrode 130 and the drain electrode 132 are disposed over the doped region 118D of the nitride-based semiconductor layer 118, the protection layer 122, and the isolation layer 120. The source electrode 130 and the drain electrode 132 are located and at the opposite sides of the gate electrode 140. The source electrode 130 and the drain electrode 132 can penetrate the isolation layer 120 and the protection layer 122 to make contact with the nitride-based semiconductor layer 118. The source electrode 130 and the drain electrode 132 can form ohmic contacts with the nitride-based semiconductor layer 118. The exemplary materials of the gate electrode 140 can include, for example but are not limited to, Ni, Ti, Au, or combinations thereof.

A method for manufacturing the semiconductor device 100 as above is provided as follows. In the following descriptions, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, MBE, HVPE, or other suitable processes.

FIG. 2 illustrates a flow chart of a method for manufacturing a semiconductor device according to some embodiments of the present disclosure. The method at least includes steps S10, S20, S30, S40, S50, S60, S70, and S80. The step S10 is forming a nucleation layer on a substrate, forming a buffer layer on the nucleation layer, forming a barrier layer on the buffer layer, and forming a nitride-based semiconductor layer on the barrier layer. The step S20 is forming a protection layer on the nitride-based semiconductor layer. The step S30 is forming a recessed gate by etching a portion of the nitride-based semiconductor layer and forming a buried channel at the recessed nitride-based semiconductor layer. The step S40 is forming an oxide region in the recessed nitride-based semiconductor layer. The step S50 is forming an isolation layer. The step S60 is forming a source electrode and a drain electrode. The step S70 is forming a gate electrode. The step S80 is forming contact vias and pads for connection.

These steps S10-S80 are further described with FIG. 3A, FIG. 3B, FIG. 3C, FIG. 3D, FIG. 3E, FIG. 3F, and FIG. 3G, which illustrate different stages of a method for manufacturing a semiconductor device according to some embodiments of the present disclosure.

Figure 3B:
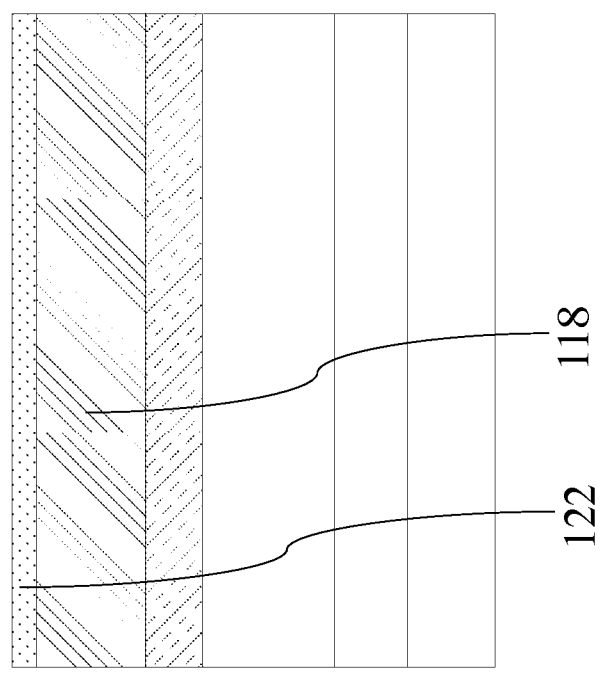
FIG. 3A, FIG. 3B, FIG. 3C, FIG. 3D, FIG. 3E, FIG. 3F, and FIG. 3G illustrate different stages of a method for manufacturing a semiconductor device according to some embodiments of the present disclosure.
Figure 3A:
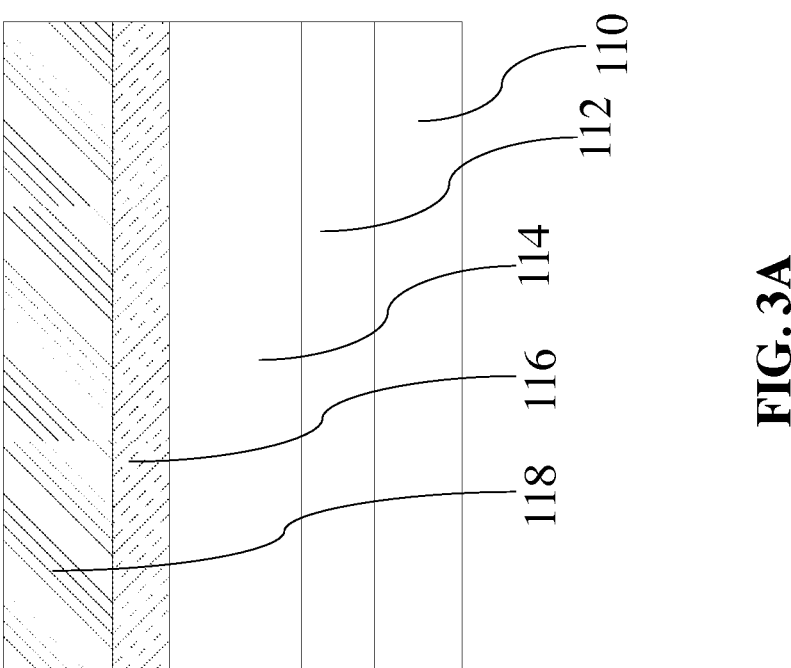

As shown in FIG. 3A, the step S10 is performed. A substrate 110 is provided. A nucleation layer 112 is formed on the substrate 110. A buffer layer 114 is formed on the nucleation layer 112. The barrier layer 116 is formed on the buffer layer 114. A nitride-based semiconductor layer 118 is formed on the barrier layer 116.

As shown in FIG. 3B, the step S20 is performed. A protection layer 122 is formed on the nitride-based semiconductor layer 118.

Figure 3D:
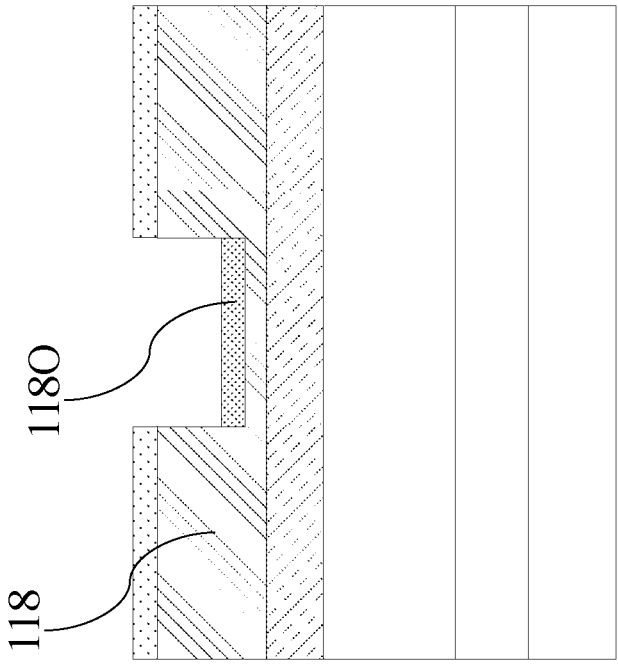
Figure 3C:
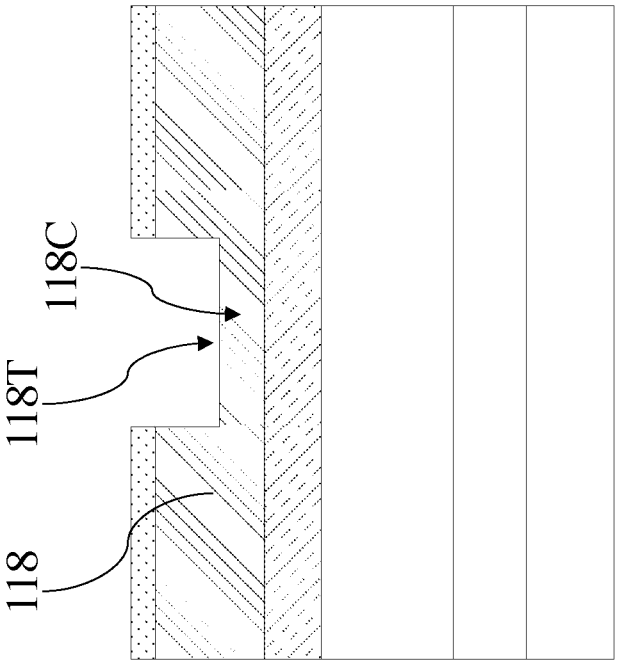

As shown in FIG. 3C, the step S30 is performed. A portion of the nitride-based semiconductor layer 118 is removed, so as to form a recessed gate (i.e., trench 118T). In some embodiments, the removing can be performed by plasma dry etching, digital etching, or a combination thereof. Thereafter, a buried channel 118C is formed in the nitride-based semiconductor layer 118. In some embodiments, the nitride-based semiconductor layer 118 is a p-GaN layer, and the buried channel 118C is formed by reducing a p-type doping concentration of a portion of the nitride-based semiconductor layer 118, in which the portion is beneath the recessed gate. In some embodiments, the reducing the p-type doping concentration to form the buried channel 118C can be achieved by oxygen plasma treatment.

As shown in FIG. 3D, the step S40 is performed. An oxide region 118O is formed in the recessed nitride-based semiconductor layer 118, which is located at the top surface of the nitride-based semiconductor layer 118. In some embodiments, the oxide region 118O is formed by surface oxidation and subsequent high temperature annealing, in which the surface oxidation includes exposing the nitride-based semiconductor layer 118 to an oxygen-containing plasma or an oxygen-containing gas. Some portions of the nitride-based semiconductor layer 118 are covered by the protection layer so they are free from the surface oxidation. In some embodiments, the high-temperature annealing includes annealing the nitride-based semiconductor layer 118 at a temperature ranging from 500° C. to 1000° C.

More specifically, the plasma oxidation can be performed by inductively coupled plasma (ICP) with an $O_2$ flow of 30 sccm. The high-temperature annealing could be done in a furnace in $N_2$ atmosphere at 800° C. for 30 minutes. Such a high-temperature annealing process is crucial to reconstruct the plasma-oxidized GaN surface and form a crystalline oxidation layer, thereby forming the oxide region 118O.

In some embodiments, the oxide region 118O is formed by atomic-layer-deposition (ALD) or chemical vapor deposition (CVD). That is, the oxide region 118O can be additionally formed on the nitride-based semiconductor layer 118.

Figure 3F:
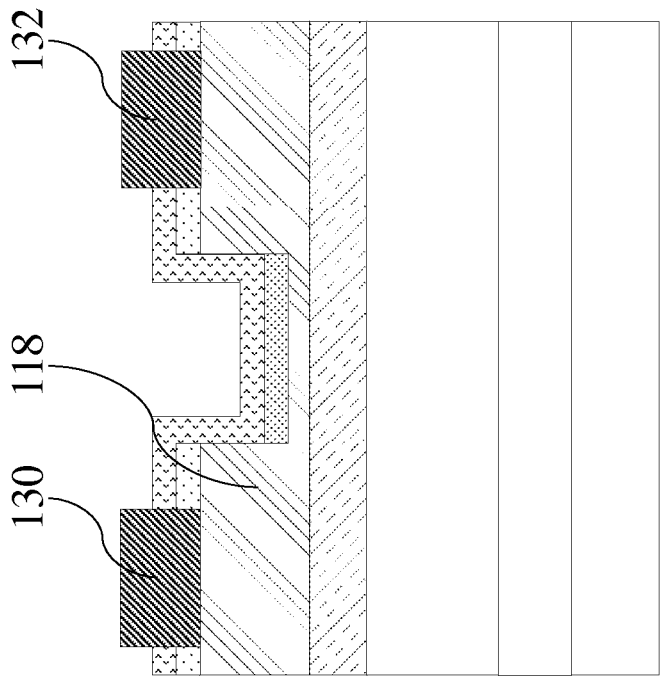
Figure 3E:
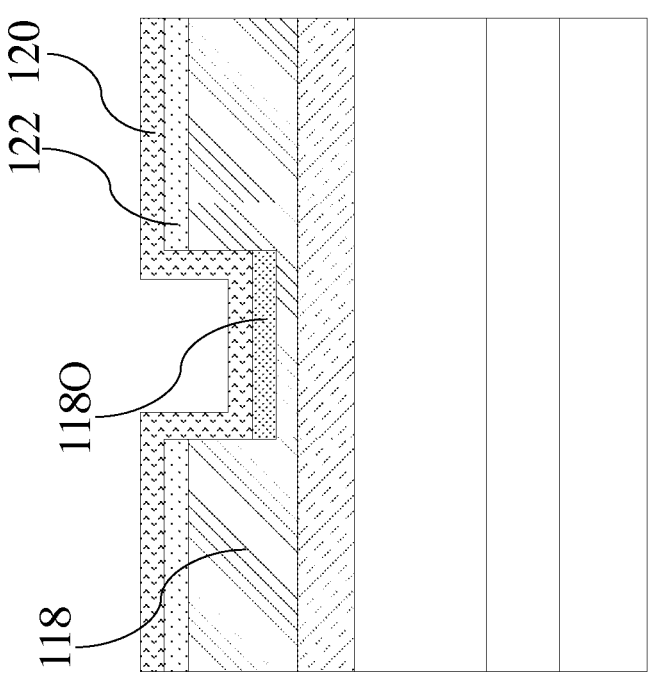

As shown in FIG. 3E, the step S50 is performed. An isolation layer 120 is formed to cover the structure. The isolation layer 120 covers the oxide region 118O of the nitride-based semiconductor layer 118 and the protection layer 122. The isolation layer 120 can align with GaN or GaON in a type-II (i.e., staggered) manner. The isolation layer 120 can be deposited from SiN prepared by plasma-enhanced chemical vapor deposition (PECVD) or low-pressure chemical vapor deposition (LPCVD). After the step S50, the isolation layer 120 is in contact with the oxide region 118O of the nitride-based semiconductor layer 118, so as to form a staggered gate stack including SiNx, GaON, or combinations thereof.

As shown in FIG. 3F, the step S60 is performed. A source electrode 130 and a drain electrode 132 are formed on the nitride-based semiconductor layer 118. The source electrode 130 and the drain electrode 132 can serve as ohmic contact metals making contact with the nitride-based semiconductor layer 118. In some embodiments, a thermal annealing process can be performed to improve contact to become ohmic.

Figure 3G:
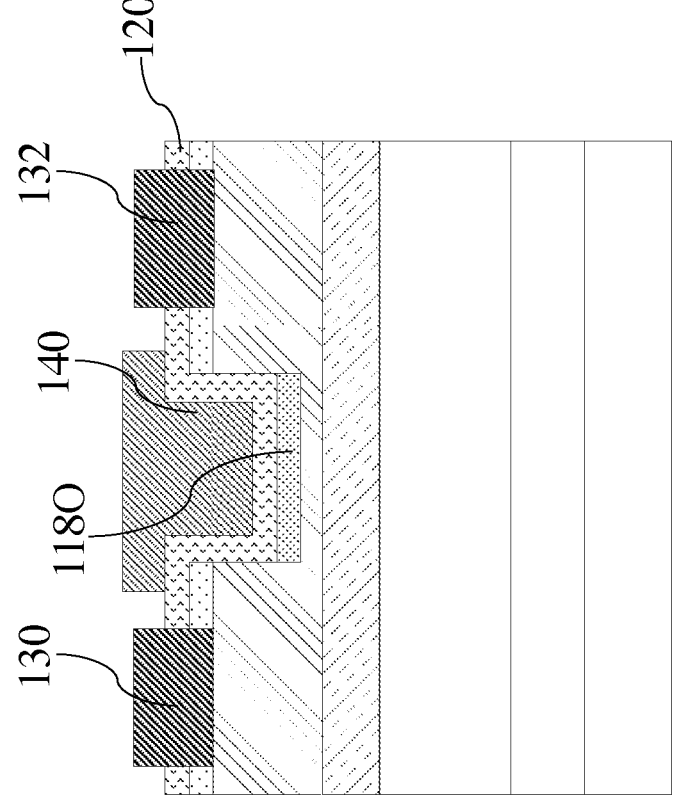

As shown in FIG. 3G, the step S70 is performed. A gate electrode 140 is formed over the isolation layer 120. In some embodiments, the gate electrode 140 vertically aligns with the oxide region 118O. The A gate electrode 140 is located between the source electrode 130 and the drain electrode 132 (i.e., the source electrode 130 and the drain electrode 132 are located at opposite sides of the gate electrode 140). Thereafter, the step S80 is performed, contact vias and pads (not illustrated) can be formed to make connection from the source electrode 130, the drain electrode 132, and the gate electrode 140 to an external circuit.

Further analysis is provided as follows.

Figure 4B:
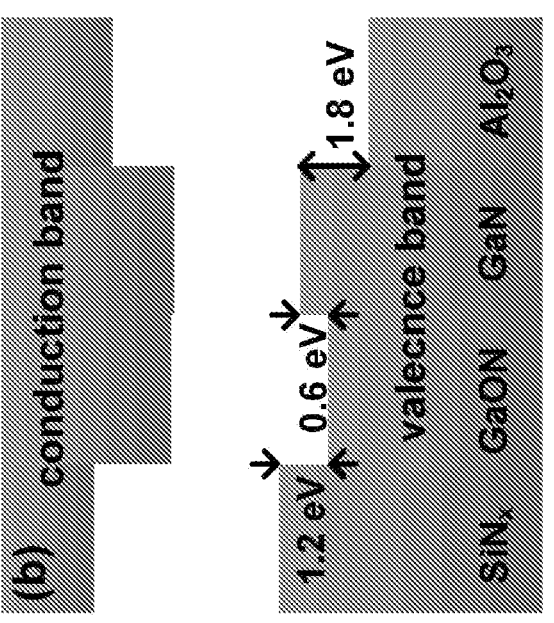
FIG. 4B shows band alignment among GaN, GaON, $SiN_x$ (shorted as SiN) and $Al_2O_3$.
Figure 4A:
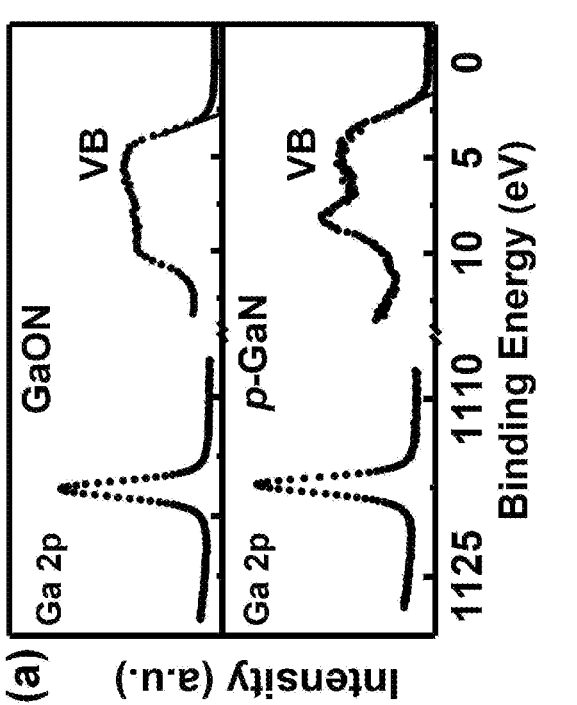
FIG. 4A shows XPS band spectra of a semiconductor device.

FIG. 4A shows XPS band spectra of a semiconductor device, and FIG. 4B shows band alignment among GaN, GaON, SiN and $Al_2O_3$. As shown in FIG. 4A, there are XPS band spectra of p-GaN and GaON, in which the VB edge of GaON shifts away from the Fermi level compared to p-GaN's. As shown in FIG. 4B, there is band alignment among GaN, GaON, SiN and $Al_2O_3$. Thus, the GaON/SiN/p-GaN gate stack is reasonably chosen to improve the device performance.

Figure 5C:
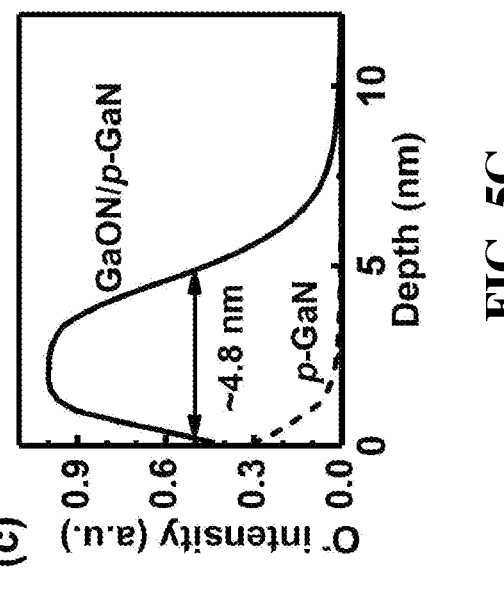
FIG. 5C shows a thickness of GaON measured from secondary-ion mass-spectroscopy according to some embodiments of the present disclosure.
Figure 5B:
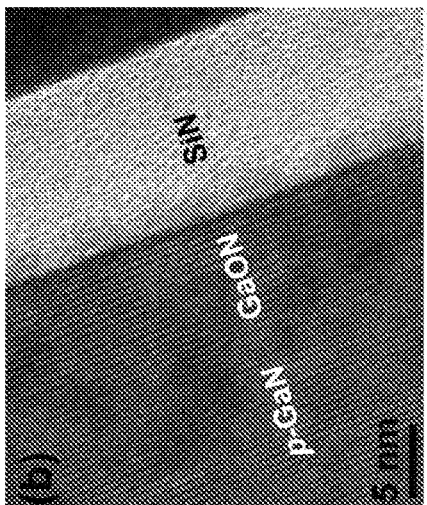
FIGS. 5A and 5B show TEM figures of a SiN/GaON p-FET according to some embodiments of the present disclosure.
Figure 5A:
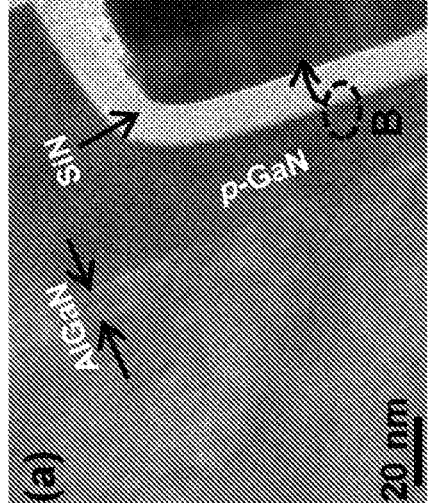

FIGS. 5A and 5B show TEM figures of a SiN/GaON p-FET according to some embodiments of the present disclosure, and FIG. 5C shows a thickness of GaON measured from secondary-ion mass-spectroscopy according to some embodiments of the present disclosure. These drawings show how the about thickness of GaON is.

Figures 6A, 6B, 6C:
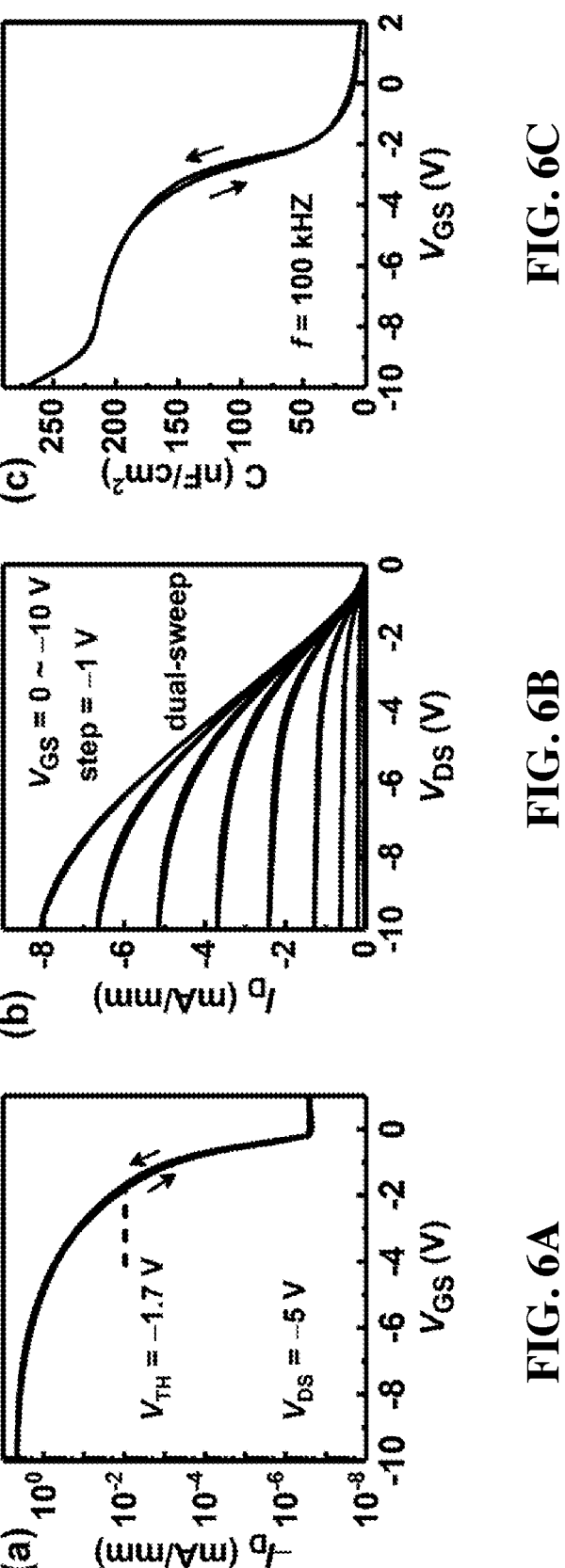
FIG. 6A shows dual-sweep transfer of a SiN/GaON p-FET according to some embodiments of the present disclosure.
FIG. 6B shows dual-sweep output curves of a SiN/GaON p-FET according to some embodiments of the present disclosure.
FIG. 6C shows dual-sweep gate capacitance-voltage of SiN/GaON capacitor according to some embodiments of the present disclosure.

FIG. 6A shows dual-sweep transfer of a SiN/GaON p-FET according to some embodiments of the present disclosure, FIG. 6B shows dual-sweep output curves of a SiN/GaON p-FET according to some embodiments of the present disclosure, and FIG. 6C shows dual-sweep gate capacitance-voltage of SiN/GaON capacitor according to some embodiments of the present disclosure. All curves in FIGS. 6A-6C are dual swept. The devices shown in FIGS. 6A-6C are p-FET having a SiN/GaON interface with $L_{GS}/L_G/L_{GD}$=4/2/4 μm.

Figures 7A, 7B, 7C:
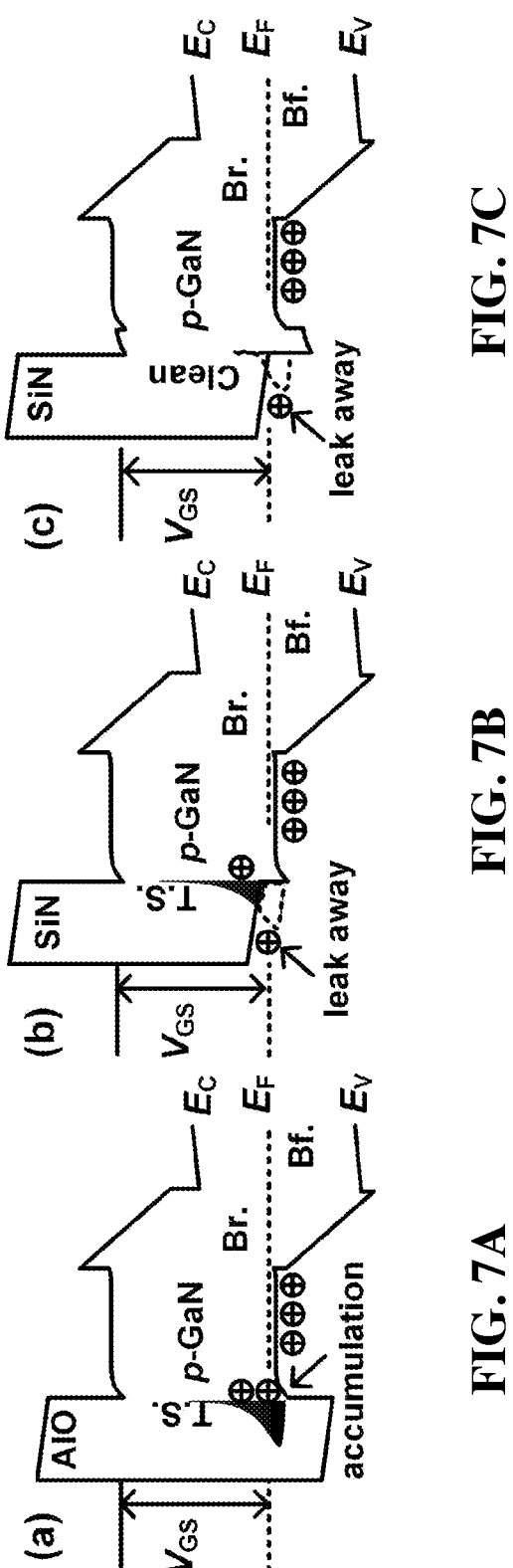
FIG. 7A, FIG. 7B, and FIG. 7C show schematic band diagrams among different gate stacks at ON-state according to some embodiments of the present disclosure.

FIG. 7A, FIG. 7B, and FIG. 7C show schematic band diagrams among different gate stacks at ON-state according to some embodiments of the present disclosure. FIG. 7A shows schematic band diagrams of p-channel GaN FETs with $Al_2O_3$ gate stack at ON-state. FIG. 7B shows schematic band diagrams of p-channel GaN FETs with SiN gate stack at ON-state. FIG. 7C shows schematic band diagrams of p-channel GaN FETs with SiN/GaON gate stack at ON-state. In the drawings, "AlO" represents $Al_2O_3$; "T.S." represents trap states; "Br" represents AlGaN barrier; "Bf." represents GaN buffer.

Figure 8:
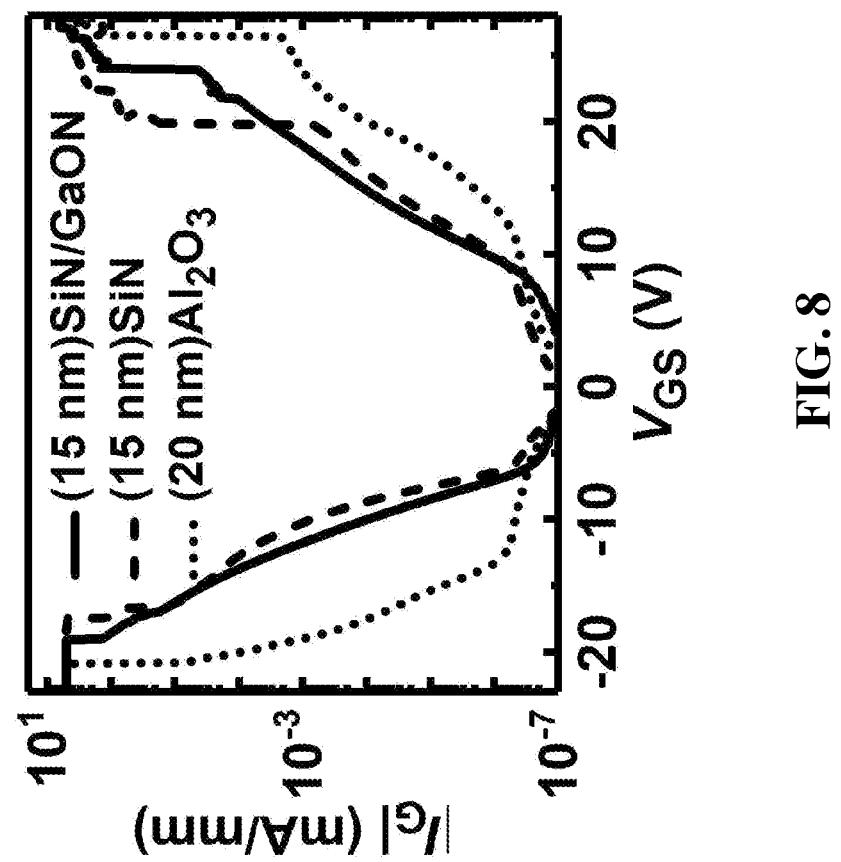
FIG. 8 shows gate breakdown characteristics of p-FETs with different gate stacks according to some embodiments of the present disclosure.

FIG. 8 shows gate breakdown characteristics of p-FETs with different gate stacks according to some embodiments of the present disclosure. The different gate stacks, including SiN/GaON, SiN, and $Al_2O_3$, are shown in the same graph.

Figures 9A, 9B:
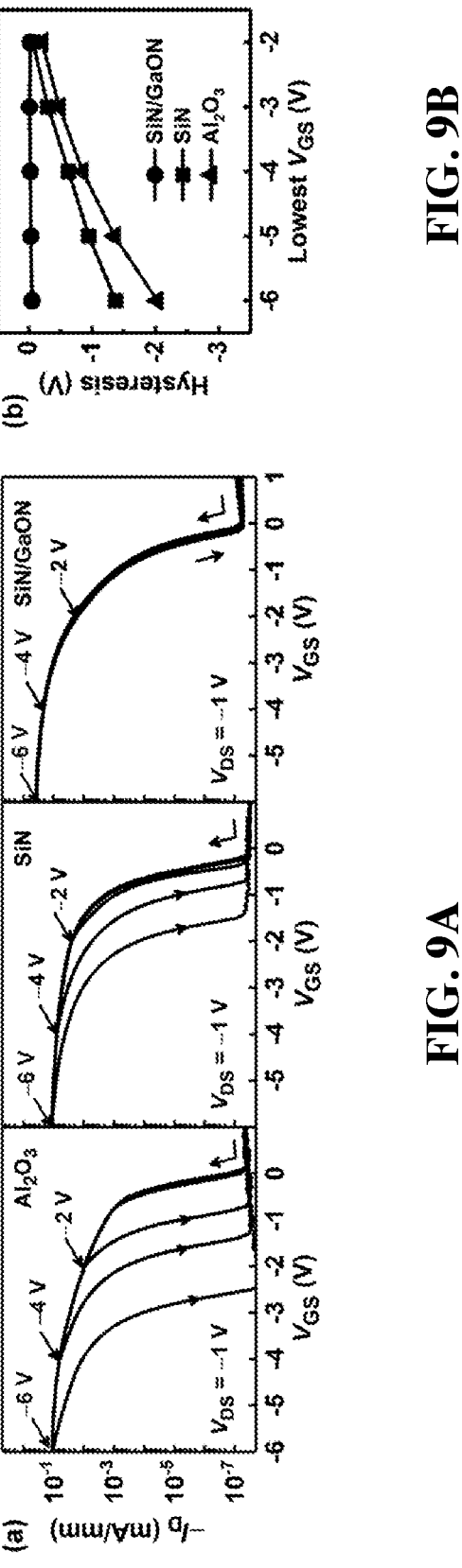
FIG. 9A shows dual-sweep transfer curves for comparison among different devices.
FIG. 9B shows a voltage hysteresis windows for comparison among different devices.

FIG. 9A shows dual-sweep transfer curves for comparison among different devices, and FIG. 9B shows a voltage hysteresis windows for comparison among different devices. FIG. 9A shows dual-sweep transfer curves of three kinds of GaN p-FETs at different $V_{GS}$ sweep ranges, including $Al_2O_3$, SiN, and SiN/GaON, in which all $V_{GS}$ sweeps are started from +1 V but stopped at different negative values and then swept back. FIG. 9B shows voltage hysteresis windows exhibited by the three devices with different $V_{GS}$ sweep ranges, including SiN/GaON, SiN, and $Al_2O_3$.

Figures 10A, 10B:
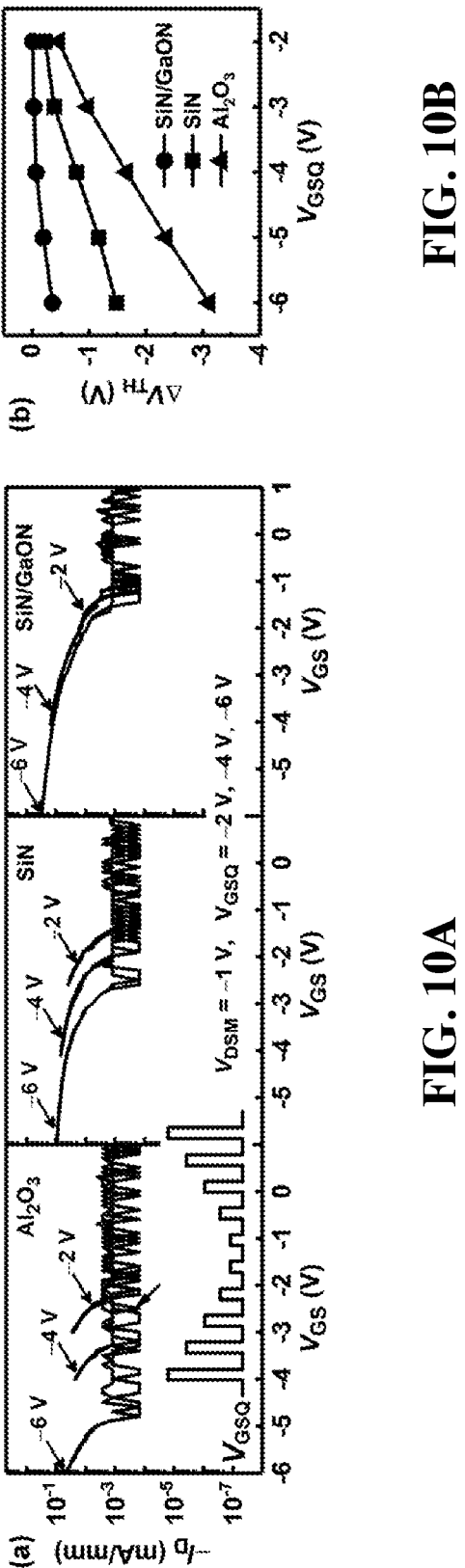
FIG. 10A shows a dual-sweep pulse-mode transfer curves for comparison among different devices.
FIG. 10B shows $V_{TH}$ shift at different $V_{GSQ}$ for comparison among different devices.

FIG. 10A shows a dual-sweep pulse-mode transfer curves for comparison among different devices, and FIG. 10B shows $V_{TH}$ shift at different $V_{GSQ}$ for comparison among different devices.

FIG. 10A shows dual-sweep pulse-mode transfer curves of three kinds of GaN p-FETs with different gate stack at different quiescent $V_{GS}$ values ($V_{GSQ}$), including $Al_2O_3$, SiN, and SiN/GaON. FIG. 10B shows VTH shift of above p-FETs at different $V_{GSQ}$. Insert shows a schematic gate voltage waveform. "$V_{DSM}$" represents drain voltage applied in the pulse for measurement. The quiescent $V_{DS}$ is 0 V. The noise floor is limited by the resolution of the high-speed pulse I-V system. The pulse width and period are 10 μs and 20 ms, respectively.

Figures 11A, 11B, 11C:
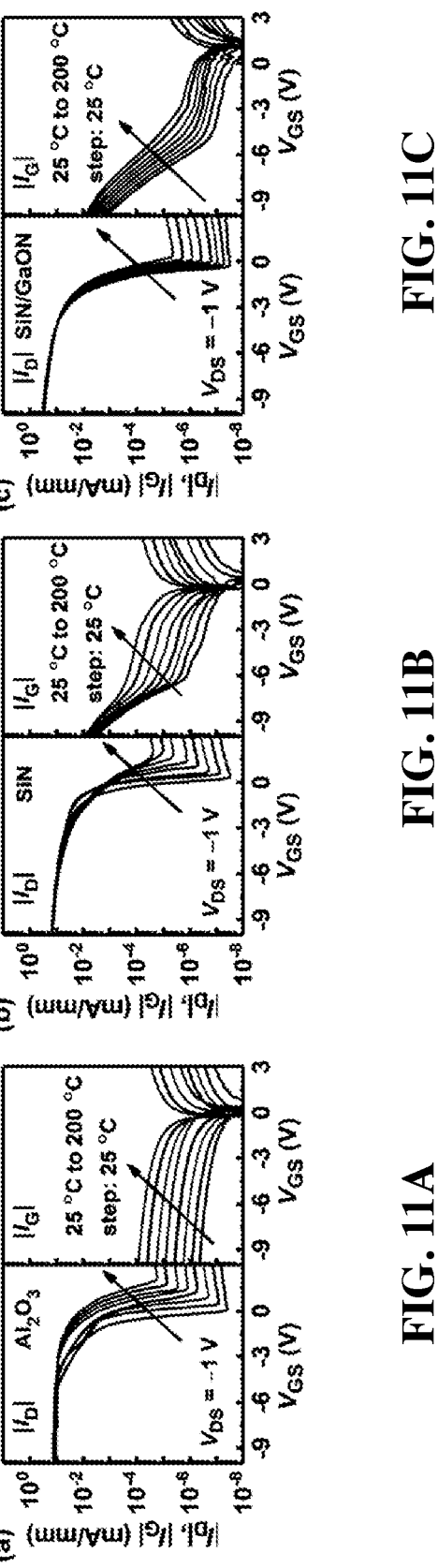
FIGS. 11A, FIG. 11B, and FIG. 11C show temperature-dependent transfer characteristics among different devices.

FIGS. 11A, FIG. 11B, and FIG. 11C show temperature-dependent transfer characteristics among different devices. FIG. 11A shows temperature-dependent transfer characteristics ($I_D$-$V_G$ and $I_G$-$V_G$) of GaN p-FETs with $Al_2O_3$ gate stack measured from 25° C. to 200° C. FIG. 11B shows temperature-dependent transfer characteristics ($I_D$-$V_G$ and $I_G$-$V_G$) of GaN p-FETs with SiN gate stack measured from 25° C. to 200° C. FIG. 11C shows temperature-dependent transfer characteristics ($I_D$-$V_G$ and $I_G$-$V_G$) of GaN p-FETs with SiN/GaON gate stack measured from 25° C. to 200° C.

Figures 12A, 12B, 12C:
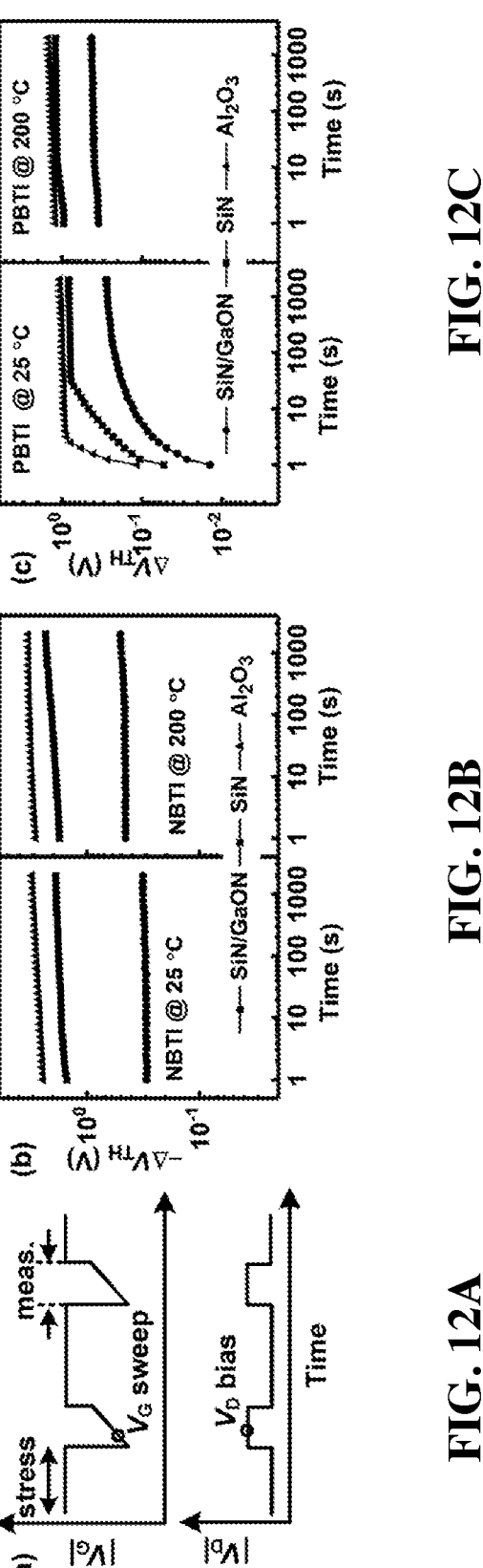
FIG. 12A, FIG. 12B, and FIG. 12C show NBTI and PBTI characterizations among different devices as switching waveforms of $V_D$ and $V_G$ in the BTI measurement.

FIG. 12A, FIG. 12B, and FIG. 12C show NBTI and PBTI characterizations among different devices as switching waveforms of $V_D$ and $V_G$ in the BTI measurement. FIG. 12A shows Schematics switching waveforms of $V_D$ and $V_G$ in the BTI measurement, in which $V_{TH}$ shifts during long-term. FIG. 12B shows NBTI and PBTI characterizations of GaN p-FETs with three kinds of gate stack under negative-bias-temperature-instability (NBTI, $V_G$=−5 V) test at both 25° C. and 200° C., including SiN/GaON, SiN, and $Al_2O_3$. FIG. 12B shows NBTI and PBTI characterizations of GaN p-FETs with three kinds of gate stack under positive-bias-temperature-instability (PBTI, $V_G$=5 V) test at both 25° C. and 200° C., including SiN/GaON, SiN, and $Al_2O_3$.

Figure 13:
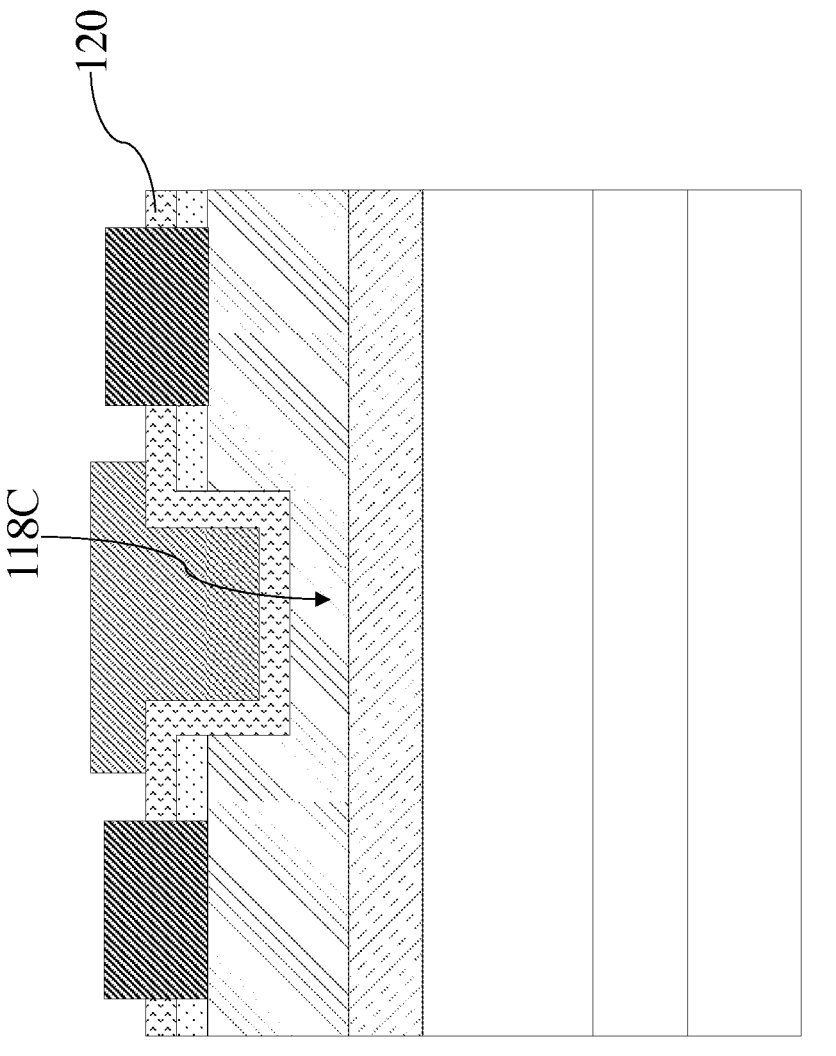
FIG. 13 is a vertical view of a semiconductor device according to some embodiments of the present disclosure.

FIG. 13 is a vertical view of a semiconductor device 100B according to some embodiments of the present disclosure. The nitride-based semiconductor device 100B is similar to the semiconductor device 100A as described and illustrated with reference to FIG. 1, except that the oxide region 118O of the semiconductor device 100A is omitted. The isolation layer 120 can directly make contact with the channel region 118C of the nitride-based semiconductor layer 118. The materials of the isolation layer 120 are selected such that the isolation layer 120 and nitride-based semiconductor channel 118C can follow the staggered gate stack alignment, which called type-II energy band alignment.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:

a buffer layer;

a barrier layer disposed on the buffer layer;

a nitride-based semiconductor layer disposed on the barrier layer and having a channel region and a doped region abutting against each other, wherein the nitride-based semiconductor layer further has an oxide region over the channel region, and wherein the nitride-based semiconductor layer has a bandgap less than a bandgap of the barrier layer, which forms a heterojunction therebetween, thereby generating a two-dimensional hole gas (2DHG) region adjacent to the heterojunction and thus forming a gallium nitride (GaN) buried-channel p-field-effect transistor (p-FET);

an isolation layer covering the nitride-based semiconductor layer, wherein the isolation layer covers the oxide region of the nitride-based semiconductor layer, and wherein the channel region is configured to act as a buried channel located between the oxide region of the nitride-based semiconductor layer and the barrier layer;

a gate electrode disposed over the isolation layer of the nitride-based semiconductor layer, wherein the gate electrode is disposed over the oxide region of the nitride-based semiconductor layer, and a portion of the isolation layer and the oxide region of the nitride-based semiconductor layer collectively form a staggered gate stack between the barrier layer and the gate electrode; and a source electrode and a drain electrode disposed over the nitride-based semiconductor layer and at opposite sides of the gate electrode.

2. The semiconductor device of claim 1, wherein the nitride-based semiconductor layer has a trench to accommodate the portion of the isolation layer.

3. The semiconductor device of claim 2, wherein the oxide region of the nitride-based semiconductor layer is adjacent to a bottom of the trench, and wherein a thickness of the oxide region of the nitride-based semiconductor layer is less than a depth of the trench.

4. The semiconductor device of claim 2, wherein the portion of the isolation layer and the oxide region of the nitride-based semiconductor layer have the same width.

5. The semiconductor device of claim 2, wherein the isolation layer extends from a position over the top-most surface of the nitride-based semiconductor layer to the trench.

6. The semiconductor device of claim 1, wherein the nitride-based semiconductor layer comprises GaN and the doped region is formed by p-doped GaN.

7. The semiconductor device of claim 1, wherein the isolation layer wraps a bottom of the gate electrode.

8. A method for manufacturing a semiconductor device, comprising:

forming a buffer layer on a substrate;

forming a barrier layer on the buffer layer;

forming a nitride-based semiconductor layer on the barrier layer, wherein the nitride-based semiconductor layer has a channel region and a doped region abutting against each other, and wherein the nitride-based semiconductor layer has a bandgap less than a bandgap of the barrier layer to form a heterojunction therebetween;

forming a recessed region in the nitride-based semiconductor layer and forming a buried channel corresponding to the channel region in the nitride-based semiconductor layer;

forming an oxide region over the buried channel in the nitride-based semiconductor layer such that the buried channel is located between the oxide region of the nitride-based semiconductor layer and the barrier layer;

forming an isolation layer covering the nitride-based semiconductor layer and the oxide region of the nitride-based semiconductor layer;

forming a gate electrode over the isolation layer and over the oxide region of the nitride-based semiconductor layer; and forming a source electrode and a drain electrode that directly contact the nitride-based semiconductor layer at opposite sides of the gate electrode.

9. The method of claim 8, wherein the buried channel is formed by reducing a p-type doping concentration of a portion of the nitride-based semiconductor layer.

10. The method of claim 9, wherein the buried channel is formed by oxygen plasma treatment.

11. The method of claim 8, wherein the isolation layer is in contact with the oxide region of the nitride-based semiconductor layer so as to form a staggered gate stack comprising SiNx, GaON, or combinations thereof.

12. The method of claim 8, wherein the oxide region is formed by surface oxidation and subsequent high temperature annealing.

13. The method of claim 12, wherein the surface oxidation comprises exposing the nitride-based semiconductor layer to an oxygen-containing plasma or an oxygen-containing gas.

14. The method of claim 12, wherein the high-temperature annealing comprises annealing the nitride-based semiconductor layer at a temperature ranging from 500° C. to 1000° C.

15. The method of claim 11, wherein the oxide region of the nitride-based semiconductor layer is composed of gallium oxynitride (GaON), and a thickness of GaON measured from secondary-ion mass-spectroscopy has a full width at half maximum of 4.8 nm.

16. The semiconductor device of claim 3, wherein a distance from the topmost surface of the oxide region of the nitride-based semiconductor layer to the barrier layer is less than a distance from the topmost surface of the nitride-based semiconductor layer to the barrier layer.

17. The semiconductor device of claim 16, wherein the oxide region of the nitride-based semiconductor layer is composed of gallium oxynitride (GaON), and a thickness of GaON measured from secondary-ion mass-spectroscopy has a full width at half maximum of 4.8 nm.

18. The semiconductor device of claim 1, wherein the isolation layer and the oxide region of the nitride-based semiconductor layer comprise a dielectric material and semiconductor material, respectively, which have a type-II energy band alignment in the staggered gate stack, and the staggered gate stack comprises GaON, $SiN_x$, or combinations thereof.

* * * * *